US012745654B2

(12) United States Patent
Rokubuichi et al.

(10) Patent No.: US 12,745,654 B2
(45) Date of Patent: Sep. 22, 2026

(54) SEMICONDUCTOR DEVICE AND POWER CONVERTER

(71) Applicant: Mitsubishi Electric Corporation, Tokyo (JP)

(72) Inventors: Hodaka Rokubuichi, Tokyo (JP); Yasuyuki Sanda, Tokyo (JP); Kei Yamamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 337 days.

(21) Appl. No.: 18/288,999

(22) PCT Filed: May 11, 2021

(86) PCT No.: PCT/JP2021/017891
§ 371 (c)(1),
(2) Date: Oct. 31, 2023

(87) PCT Pub. No.: WO2022/239112
PCT Pub. Date: Nov. 17, 2022

(65) Prior Publication Data
US 2024/0222233 A1 Jul. 4, 2024

(51) Int. Cl.
*H10W 70/40* (2026.01)
*H10W 74/10* (2026.01)
*H10W 78/00* (2026.01)

(52) U.S. Cl.
CPC ....... *H10W 70/481* (2026.01); *H10W 70/468* (2026.01); *H10W 74/114* (2026.01); *H10W 78/00* (2026.01)

(58) Field of Classification Search
CPC ............ H10W 70/468; H10W 70/481; H10W 74/481; H10W 78/00
See application file for complete search history.

(56) References Cited

U.S. PATENT DOCUMENTS 6,566,164 B1 * 5/2003 Glenn .............. H01L 23/49524 257/E23.044
2006/0091512 A1 * 5/2006 Shinohara .............. H01L 24/72 257/E23.044

(Continued)

FOREIGN PATENT DOCUMENTS

CN 113316845 B * 8/2025 ............ H01L 24/46
JP 2006054245 A * 2/2006

(Continued)

OTHER PUBLICATIONS

International Search Report and Written Opinion mailed on Jul. 6, 2021, received for PCT Application PCT/JP2021/017891, filed on May 11, 2021, 8 pages including English Translation.

(Continued)

*Primary Examiner* — Matthew E Warren
(74) *Attorney, Agent, or Firm* — XSENSUS LLP

(57) ABSTRACT

A semiconductor device includes a lead frame having a mount surface, a semiconductor element disposed on the mount surface, a circuit board disposed apart from the mount surface in a thickness direction of the semiconductor device and electrically connected to the lead frame, a sealing resin that seals the lead frame, the semiconductor element, and the circuit board, and a connector. The lead frame has a lead exposed from the sealing resin. The circuit board has at least one exposed portion exposed from the sealing resin. A connector is electrically connected to one of the at least one exposed portion.

13 Claims, 19 Drawing Sheets

(56) References Cited

U.S. PATENT DOCUMENTS

2009/0224398 A1* 9/2009 Noritake ............... H01L 23/473 438/122
2010/0133667 A1* 6/2010 Oka ................. H01L 23/49575 257/666
2012/0074552 A1* 3/2012 Mashimo .......... H01L 23/49531 257/676
2015/0287665 A1 10/2015 Hanada

FOREIGN PATENT DOCUMENTS

JP 2009-278134 A 11/2009
JP 2014022444 A * 2/2014
JP 2019-075249 A 5/2019
WO 2014/046058 A1 3/2014

OTHER PUBLICATIONS

Notice of Reasons for Refusal mailed on Oct. 5, 2021, received for JP Application 2021-549825, 7 pages including English Translation.
Office Action of May 15, 2026 issued in the counterpart German application 11 2021 007 636.1, 8pp.

* cited by examiner

SEMICONDUCTOR DEVICE AND POWER CONVERTER

CROSS-REFERENCE TO RELATED APPLICATION

This application is based on PCT filing PCT/JP2021/017891, filed May 11, 2021, the entire contents of which are incorporated herein by reference.

TECHNICAL FIELD

The present disclosure relates to a semiconductor device and a power converter.

BACKGROUND ART

Japanese Patent Laying-Open No. 2014-22444 (PTL 1) discloses a semiconductor device. The semiconductor device disclosed in PTL 1 includes a lead frame, a semiconductor element, a control board, and a mold resin. The semiconductor element is disposed on the lead frame. The control board is disposed apart from the lead frame in a thickness direction of the semiconductor device. The mold resin seals the lead frame, the semiconductor element, and the control board. An external terminal of the lead frame and a projection of the control board are exposed from the mold resin.

CITATION LIST

Patent Literature

PTL 1: Japanese Patent Laying-Open No. 2014-22444

SUMMARY OF INVENTION

Technical Problem

In the semiconductor device disclosed in PTL 1, when the lead frame, the semiconductor element, and the control board are sealed with the mold resin, the projection of the control board is sandwiched between a lower molding mold and an upper molding mold. Therefore, only a planar electrode can be formed on the projection of the control board. Such a planar electrode is difficult to connect to a terminal of an external device.

The present disclosure has been made in view of the above problem of the related art. Specifically, the present disclosure provides a semiconductor device that is easily connected to an external device.

Solution to Problem

A semiconductor device of the present disclosure includes a lead frame having a mount surface, a semiconductor element disposed on the mount surface, a circuit board disposed apart from the mount surface in a thickness direction of the semiconductor device and electrically connected to the lead frame, a sealing resin to seal the lead frame, the semiconductor element, and the circuit board, and a connector. The lead frame includes a lead exposed from the sealing resin. The circuit board has at least one exposed portion exposed from the sealing resin. A connector is electrically connected to one of the at least one exposed portion.

Advantageous Effects of Invention

The semiconductor device of the present disclosure facilitates connection with an external device.

BRIEF DESCRIPTION OF DRAWINGS

FIG. 2 is a sectional view taken along line II-II in FIG. 1.

FIG. 10 is a sectional view taken along line X-X in FIG. 8.

DESCRIPTION OF EMBODIMENTS

Figure 1:
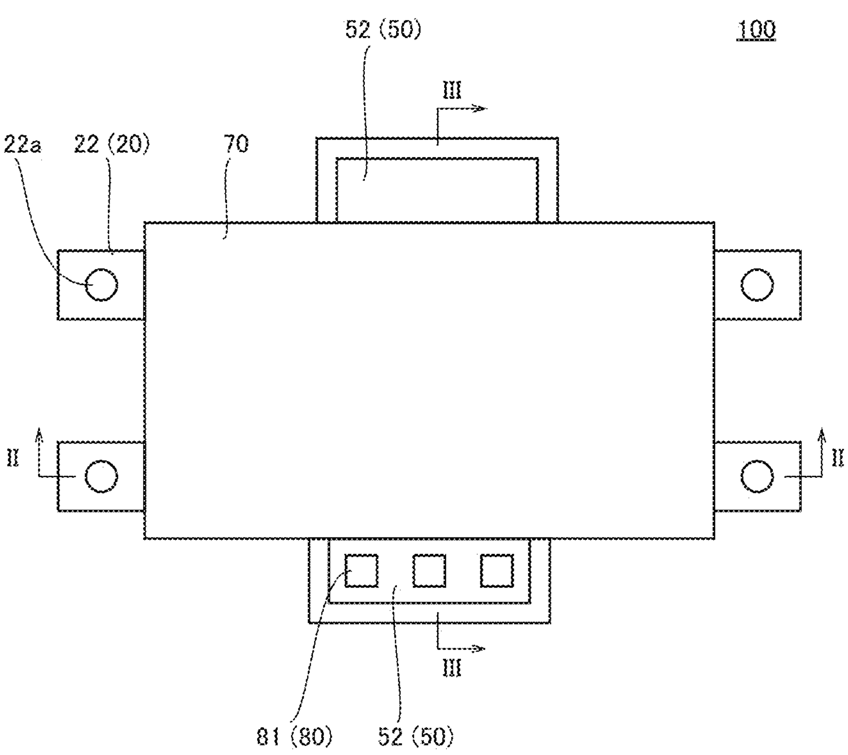
FIG. 1 is a plan view of a semiconductor device 100.

Hereinafter, embodiments of the present disclosure will be described in detail with reference to the drawings. In the drawings described below, the same or corresponding parts are denoted by the same reference signs, and redundant description will not be repeated.

First Embodiment

A semiconductor device according to a first embodiment (hereinafter referred to as "semiconductor device 100") will be described.

(Configuration of Semiconductor Device 100)

Hereinafter, a configuration of semiconductor device 100 will be described.

Figure 2:
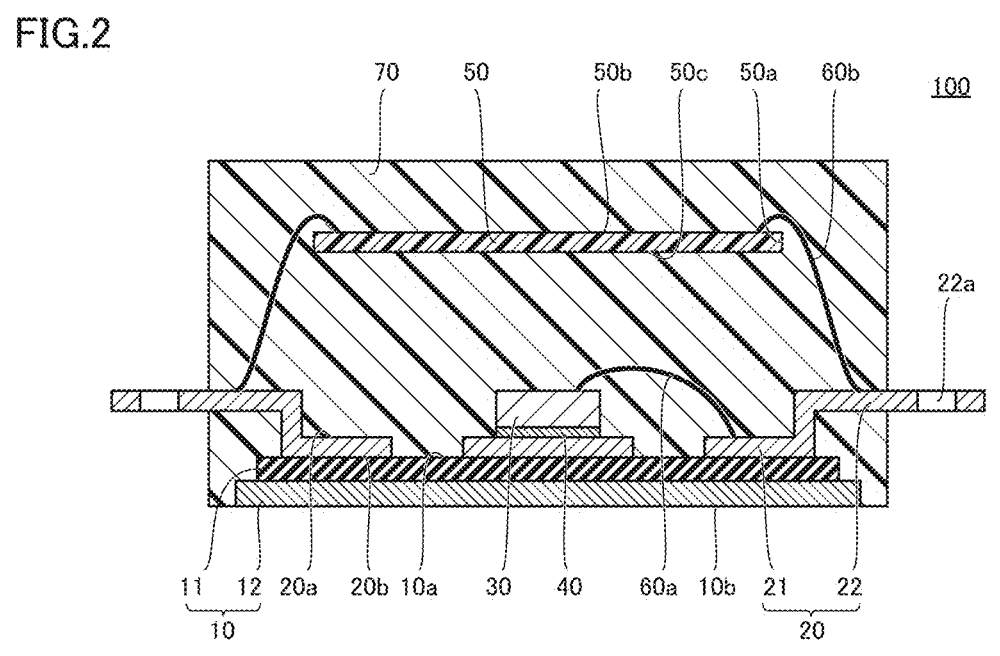
Figure 3:
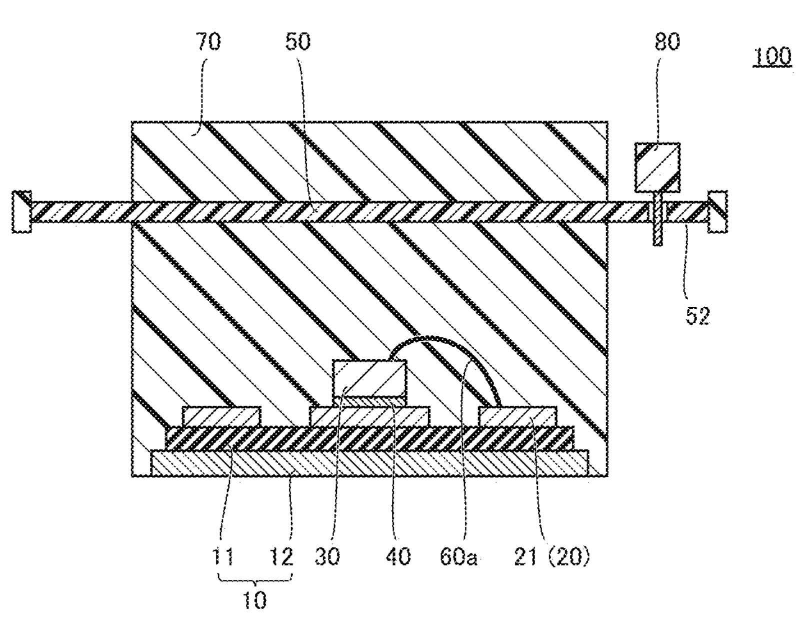
FIG. 3 is a sectional view taken along line III-III in FIG. 1.
Figure 4:
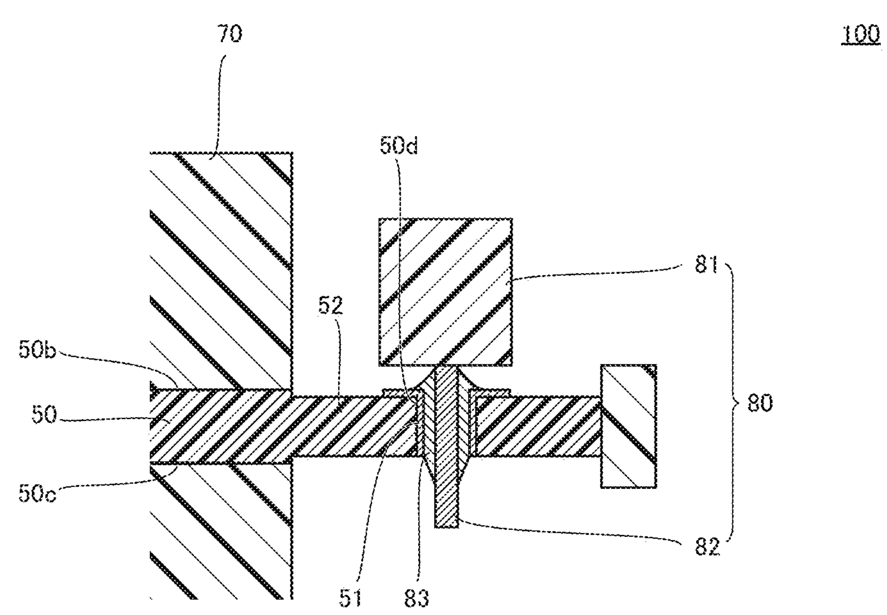
FIG. 4 is a partially enlarged view of FIG. 3.
Figure 5:
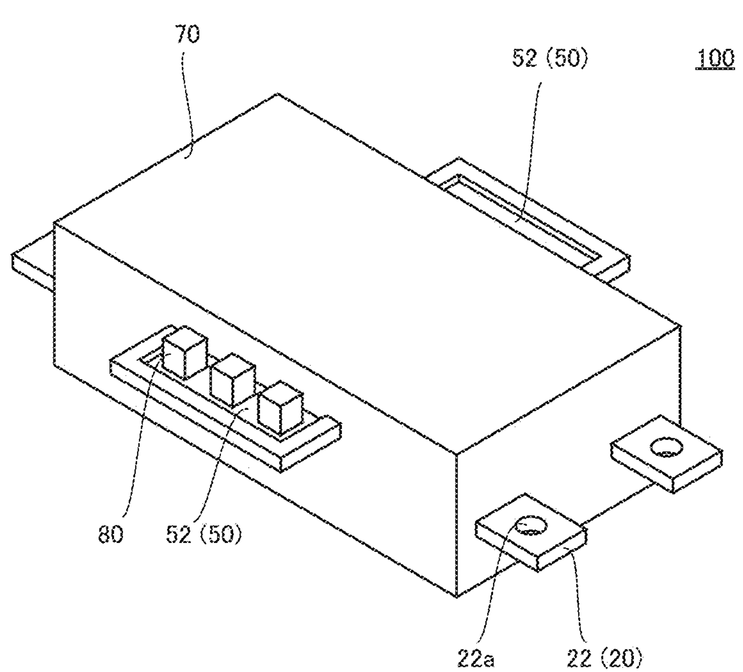
FIG. 5 is a perspective view of semiconductor device 100.

FIG. 1 is a plan view of semiconductor device 100. FIG. 2 is a sectional view taken along line II-II in FIG. 1. FIG. 3 is a sectional view taken along line III-III in FIG. 1. FIG. 4 is a partially enlarged view of FIG. 3. FIG. 5 is a perspective view of semiconductor device 100. As illustrated in FIGS. 1, 2, 3, 4, and 5, semiconductor device 100 includes an insulating base material 10, a lead frame 20, a semiconductor element 30, a connection layer 40, a circuit board 50, a wire 60*a*, a wire 60*b*, a sealing resin 70, and a connector 80.

As illustrated in FIG. 2, insulating base material 10 has a first surface 10*a* and a second surface 10*b*. First surface 10*a* and second surface 10*b* are end surfaces of insulating base material 10 in a thickness direction of semiconductor device 100. Second surface 10*b* is a surface opposite to first surface 10*a*.

As illustrated in FIGS. 2 and 3, insulating base material 10 includes an insulating sheet 11 and a metal foil 12. Insulating sheet 11 is on first surface 10*a*. Metal foil 12 is on second surface 10*b*. Insulating sheet 11 is disposed on metal foil 12.

Insulating sheet 11 includes a resin material and a filler mixed in the resin material. The resin material constituting insulating sheet 11 is a thermosetting resin such as an epoxy resin. The filler is formed with a material having high thermal conductivity. The material constituting the filler is, for example, silica, alumina, or boron nitride.

Metal foil 12 is formed with a metal material having high thermal conductivity. The metal material constituting metal foil 12 is, for example, copper or aluminum. Metal foil 12 is insulated from lead frame 20 by insulating sheet 11. Heat generated in semiconductor element 30 is transmitted to metal foil 12 by lead frame 20 and insulating sheet 11, and is released from metal foil 12 to the outside.

Lead frame 20 has a first surface 20*a* and a second surface 10*b*. First surface 20*a* and second surface 20*b* are end surfaces of lead frame 20 in the thickness direction of semiconductor device 100. First surface 20*a* is a mount surface of lead frame 20. Second surface 20*b* is a surface opposite to first surface 20*a*, and is attached to insulating base material 10.

As illustrated in FIG. 2, lead frame 20 includes a bottom 21 and a lead 22. Semiconductor element 30 is disposed on first surface 20*a* of bottom 21. Lead frame is attached to insulating base material 10 at second surface 20*b* of bottom 21. Lead 22 is connected to bottom 21. Lead 22 is farther from insulating base material 10 than bottom 21. Lead 22 is apart from insulating base material 10. Therefore, there is a level difference in a connection portion between bottom 21 and lead 22.

Lead frame 20 is formed by, for example, press-molding a copper alloy plate. The level difference at the connection portion between bottom 21 and lead 22 is formed by, for example, half punching. The level difference at the connection portion between bottom 21 and lead 22 may be formed by bending. The thickness of lead frame 20 is, for example, 0.6 mm. The height of the level difference at the connection portion between bottom 21 and lead 22 is preferably less than or equal to 0.5 times (less than or equal to 0.3 mm) the thickness of lead frame 20. The height of the level difference at the connection portion between bottom 21 and lead 22 is preferably greater than or equal to 0.1 mm.

As illustrated in FIGS. 1 and 2, a penetration hole 22*a* is formed in lead 22. Semiconductor device 100 is attached to an external device by a screw inserted into penetration hole 22*a* being screwed into the external device.

Semiconductor element 30 is, for example, a diode, a bipolar transistor, an insulated gate bipolar transistor (IGBT), a metal oxide semiconductor field effect transistor (MOSFET), or a gate turn-off thyristor (GTO). As illustrated in FIGS. 2 and 3, semiconductor element 30 is electrically connected to lead frame 20 by connection layer 40. Connection layer 40 is formed with, for example, a solder alloy or a conductive paste.

As illustrated in FIG. 2, circuit board 50 has a side surface 50*a*, a first surface 50*b*, and a second surface 50*c*. First surface 50*b* and second surface 50*c* are end surfaces of circuit board 50 in the thickness direction of semiconductor device 100. Second surface 50*c* is a surface opposite to first surface 50*b* and faces lead frame 20. First surface 50*b* and second surface 50*c* are continuous with side surface 50*a*. Circuit board 50 is apart from lead frame 20 (first surface 20*a*) in the thickness direction of semiconductor device 100.

As illustrated in FIG. 4, a through hole 50*d* is formed in circuit board 50. Through hole 50*d* penetrates circuit board 50 in a direction from second surface 50*c* toward first surface 50*b* (in the thickness direction of semiconductor device 100). A conductor film 51 is formed on an inner wall surface of through hole 50*d* and on first surface 50*b* around through hole 50*d*. Conductor film 51 is formed with a conductive metal material.

Circuit board 50 is formed with, for example, a resin material in which reinforcing fibers are dispersed. A heat resistant grade of circuit board 50 is FR-4, for example. In a case where a semiconductor element capable of high-temperature operation (for example, a semiconductor element in which a semiconductor substrate is formed with silicon carbide) is used as semiconductor element 30, the heat resistance grade of circuit board 50 may be FR-5. The thickness of circuit board 50 is, for example, 1.6 mm. However, the thickness of circuit board 50 is not limited to the above thickness.

A wiring pattern (not shown) is formed on first surface 50*b* and second surface 50*c*. The wiring pattern is connected to conductor film 51. An electric component and a semiconductor element (not shown) are connected to the wiring pattern. The electric component and the semiconductor element are preferably disposed on both first surface 50*b* and second surface 50*c*.

As illustrated in FIGS. 2 and 3, wire 60*a* connects lead frame 20 and semiconductor element 30. As illustrated in FIG. 2, wire 60*b* connects lead frame 20 and circuit board 50. As a result, circuit board 50 is electrically connected to lead frame 20. Wires 60*a* and 60*b* are, for example, aluminum wires, gold wires, or copper wires.

As illustrated in FIG. 2, sealing resin 70 seals insulating base material 10, lead frame 20, semiconductor element 30, connection layer 40, circuit board 50, the wire 60*a*, and wire 60*b*. This sealing ensures insulation between the sealed members. In addition, sealing resin 70 functions as a case of semiconductor device 100. Sealing resin 70 enters between lead 22 and insulating base material 10. This suppresses development of dielectric breakdown along an interface between metal foil 12 and sealing resin 70.

However, second surface 10*b* is exposed from sealing resin 70. Furthermore, lead 22 and a part of circuit board 50 are also exposed from sealing resin 70. Sealing resin 70 is, for example, an epoxy resin or a phenol resin. Sealing resin 70 may include a filling agent.

As illustrated in FIGS. 1, 3, and 4, a portion of circuit board 50 exposed from sealing resin 70 is defined as an exposed portion 52. The number of exposed portions 52 is at least one. The number of exposed portions 52 is preferably plural. As illustrated in FIG. 4, through hole 50*d* is located in exposed portion 52. When the number of exposed portions 52 is plural, through hole 50*d* may be provided in one of the plurality of exposed portions 52.

As illustrated in FIG. 4, sealing resin 70 is not disposed on first surface 50*b* and second surface 50*c* of exposed portion 52. In a periphery of exposed portion 52, side surface 50*a*, a peripheral edge of first surface 50*b* continuous with side surface 50*a*, and a peripheral edge of second surface 50*c* continuous with side surface 50*a* are covered with sealing resin 70.

As illustrated in FIG. 4, the thickness of exposed portion 52 is smaller than the thickness of a portion of circuit board 50 sealed with sealing resin 70. From another point of view, a level difference is formed on first surface 50*b* and second surface 50*c* at a boundary between exposed portion 52 and the portion of circuit board 50 sealed with sealing resin 70.

As illustrated in FIG. 4, connector 80 includes a case portion 81 and a terminal portion 82. Terminal portion 82 is inserted into through hole 50*d* from first surface 50*b*. Therefore, case portion 81 is disposed on first surface 50*b*. Terminal portion 82 is connected to conductor film 51 by connection layer 83. Thus, connector 80 is electrically connected to circuit board 50. Connection layer 83 is formed with, for example, a solder alloy.

An opening of case portion 81 faces upward (in a direction from second surface 50*c* to first surface 50*b*), for example. Case portion 81 is formed with, for example, polyphenylene sulfide (PPS) resin or polybutylene terephthalate (PBT) resin.

Lead 22 preferably serves as a main circuit terminal of semiconductor device 100. Connector 80 preferably serves as a control terminal (gate terminal, sense terminal) of semiconductor device 100. From another point of view, a current flowing through connector 80 is preferably smaller than a current flowing through lead 22.

(Method of Manufacturing Semiconductor Device 100)

Hereinafter, a method of manufacturing semiconductor device 100 will be described.

Figure 6:
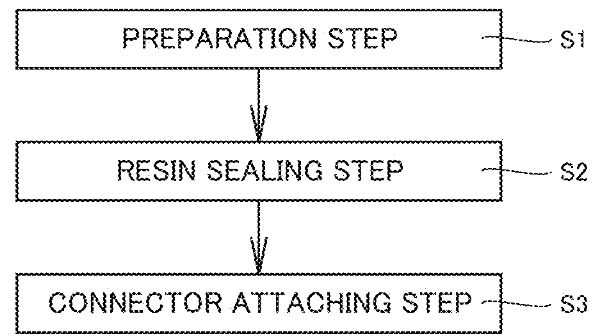
FIG. 6 is a step chart illustrating a method of manufacturing semiconductor device 100.

FIG. 6 is a step chart illustrating the method of manufacturing semiconductor device 100. As illustrated in FIG. 6, the method of manufacturing semiconductor device 100 includes a preparation step S1, a resin sealing step S2, and a connector attaching step S3. Resin sealing step S2 is performed after preparation step S1. Connector attaching step S3 is performed after resin sealing step S2.

In preparation step S1, insulating base material 10, lead frame 20, semiconductor element 30, and circuit board 50 are prepared. At this point, lead frame 20 is disposed on insulating base material 10, semiconductor element 30 is connected to lead frame 20 by connection layer 40 and wire 60*a*, and circuit board 50 is connected to lead frame 20 by wire 60*b*. However, at this point of time, connector 80 is not connected to circuit board 50.

In resin sealing step S2, insulating base material 10, lead frame 20, semiconductor element 30, connection layer 40, circuit board 50, wire 60*a*, and wire 60*b* are sealed with sealing resin 70. Resin sealing step S2 is performed by, for example, a transfer molding method. Resin sealing step S2 may be performed by an injection molding method or a compression molding method.

Figure 7:
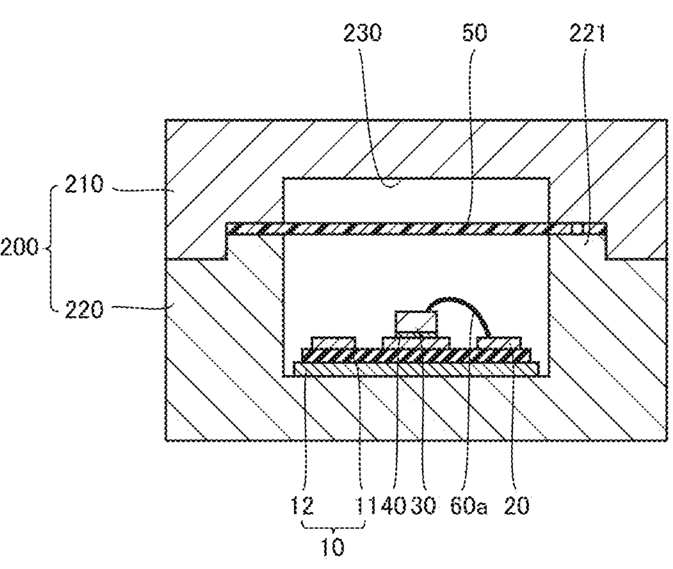
FIG. 7 is an explanatory view for describing a resin sealing step S2 in the method of manufacturing semiconductor device 100.

FIG. 7 is an explanatory view for describing resin sealing step S2 in the method of manufacturing semiconductor device 100. In resin sealing step S2, firstly, a mold 200 is prepared. As illustrated in FIG. 7, mold 200 includes an upper mold 210 and a lower mold 220. Inside mold 200, there is a cavity 230 defined by upper mold 210 and lower mold 220. In resin sealing step S2, secondly, insulating base material 10, lead frame 20, semiconductor element 30, connection layer 40, circuit board 50, wire 60*a*, and wire 60*b* are disposed in cavity 230.

Lower mold 220 includes a support portion 221. The number of support portions 221 is at least one. The number of support portions 221 is equal to the number of portions of circuit board 50 to be exposed portions 52. A portion of circuit board 50 to be exposed portion 52 is sandwiched between upper mold 210 and support portion 221. First surface 50*b* and second surface 50*c* in the portion of circuit board 50 to be exposed portion 52 are preferably designed or additionally processed to be flat.

In resin sealing step S2, second, uncured sealing resin 70 is supplied to mold 200. As a result, cavity 230 is filled with uncured sealing resin 70. However, since the portion of circuit board 50 to be exposed portion 52 is sandwiched between upper mold 210 and support portion 221, uncured sealing resin 70 is not supplied to the portion of circuit board 50 to be exposed portion 52.

In resin sealing step S2, third, uncured sealing resin 70 in cavity 230 is heated to be cured. As a result, insulating base material 10, lead frame 20, semiconductor element 30, connection layer 40, circuit board 50, wire 60*a*, and wire 60*b* are sealed with sealing resin 70. Since the portion of circuit board 50 to be exposed portion 52 is sandwiched between upper mold 210 and support portion 221, the thickness of exposed portion 52 is smaller than the thickness of the portion of circuit board 50 sealed with sealing resin 70.

In connector attaching step S3, connector 80 is attached. Connector 80 is attached by soldering terminal portion 82 and conductor film 51 in a state where terminal portion 82 is inserted into through hole 50*d*. As described above, semiconductor device 100 having the structure illustrated in FIGS. 1, 2, 3, 4, and 5 is manufactured.

(Effects of Semiconductor Device 100)

In semiconductor device 100, since connector 80 is attached to the portion (exposed portion 52) of circuit board 50 exposed from sealing resin 70, it can be connected to a control board of an external device via connector 80. Therefore, semiconductor device 100 facilitates connection with the external device.

In semiconductor device 100, since the control board of the external device can be connected by connector 80, it is not necessary to take out the control terminal of semiconductor device 100 from lead frame 20. Therefore, semiconductor device 100 facilitates a design of lead frame 20. It is not necessary to take out the control terminal of semiconductor device 100 from lead frame 20, and as a result, an interval between leads 22 can be widened. Therefore, in semiconductor device 100, an insulation distance between leads 22 can be secured without increasing a footprint of semiconductor device 100.

In a case where circuit board 50 has the plurality of exposed portions 52, circuit board 50 is sandwiched between upper mold 210 and support portion 221 at a plurality of places while resin sealing step S2 is performed. Therefore, in this case, inclination of circuit board 50 while resin sealing step S2 is performed is suppressed.

In a case where the height of the level difference at the connection portion between bottom 21 and lead 22 is less than or equal to 0.3 mm (less than or equal to 0.5 times the thickness of lead frame 20), a strength of lead frame 20 can be easily secured.

In a case where the height of the level difference at the connection portion between bottom 21 and lead 22 is greater than or equal to 0.1 mm, generation of voids in sealing resin 70 filled between insulating base material 10 and lead frame 20 is suppressed.

In a case where the electric component and the semiconductor element are disposed on both first surface 50*b* and second surface 50*c* of circuit board 50, a difference between a coefficient of thermal expansion on first surface 50*b* of circuit board 50 and a coefficient of thermal expansion on second surface 50*c* of circuit board 50 can be reduced, and a rigidity of circuit board 50 is increased. Therefore, in this case, a warpage of circuit board 50 can be reduced.

Second Embodiment

A semiconductor device according to a second embodiment (hereinafter referred to as "semiconductor device 100A") will be described. Here, differences from semiconductor device 100 will be mainly described, and redundant description will not be repeated.

(Configuration of Semiconductor Device 100A)

Hereinafter, a configuration of semiconductor device 100A will be described.

Figure 8:
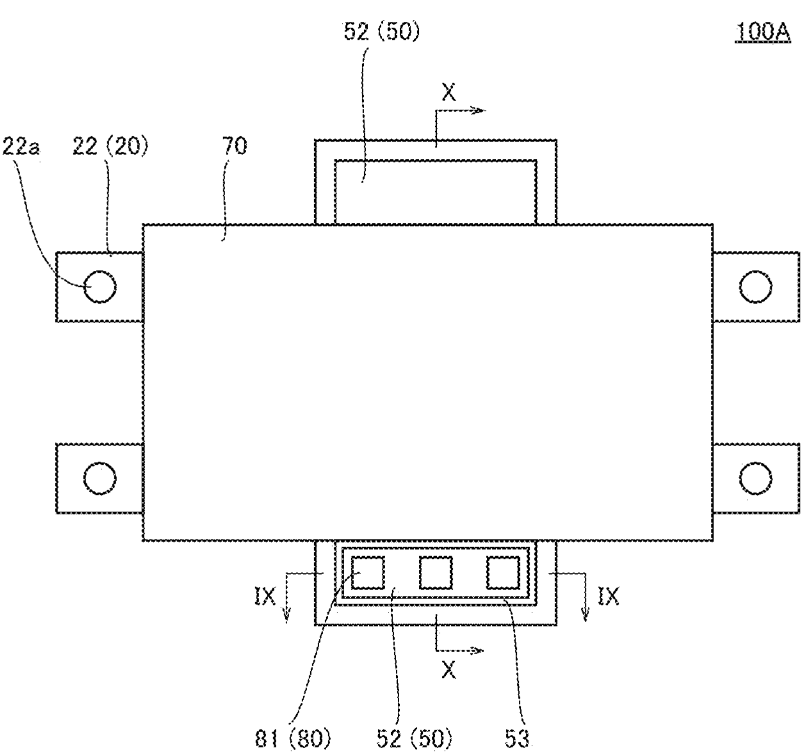
FIG. 8 is a plan view of a semiconductor device 100A.
Figure 9:
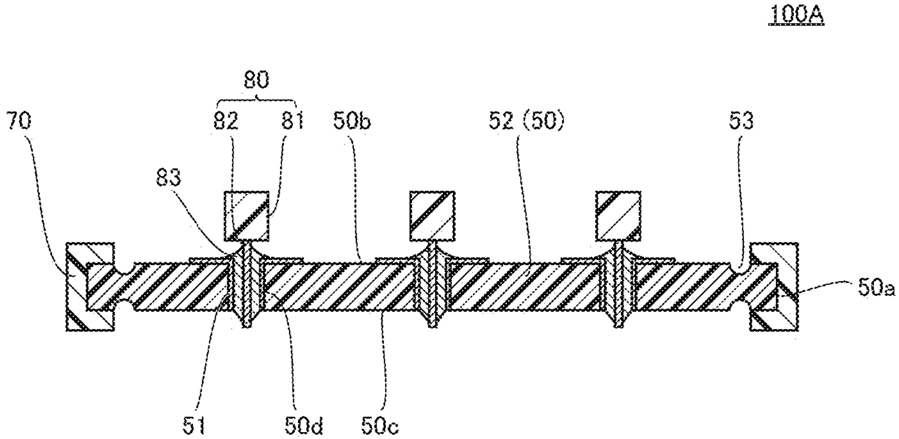
FIG. 9 is a sectional view taken along line IX-IX in FIG. 8.
Figure 10:
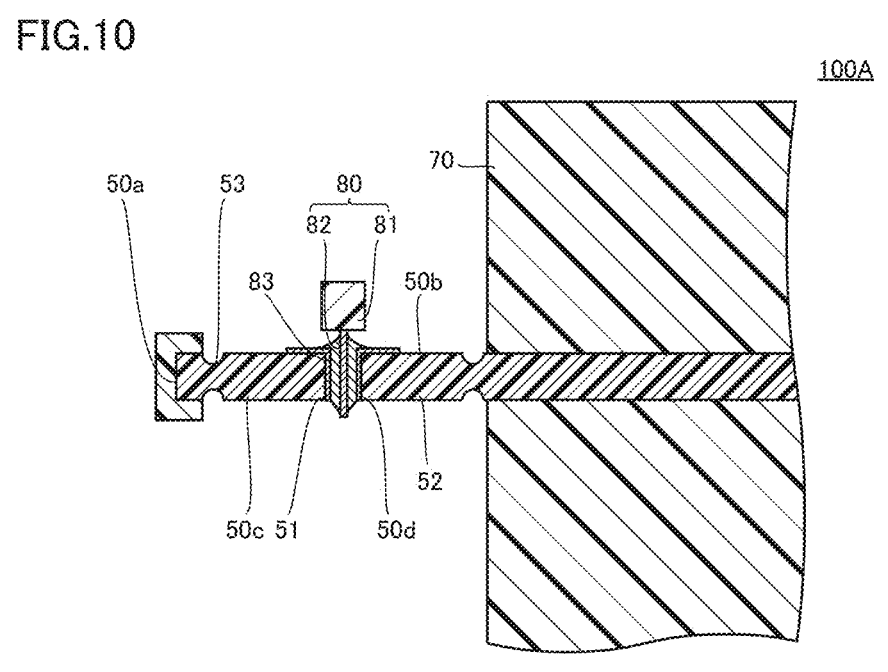

FIG. 8 is a plan view of semiconductor device 100A. FIG. 9 is a sectional view taken along line IX-IX in FIG. 8. FIG. 10 is a sectional view taken along line X-X in FIG. 8. As illustrated in FIGS. 8, 9, and 10, semiconductor device 100A is different from semiconductor device 100 in the structure of exposed portion 52 and a periphery of exposed portion 52.

As illustrated in FIGS. 8, 9, and 10, in semiconductor device 100A, a groove 53 is formed at the boundary between exposed portion 52 and the portion of circuit board 50 sealed with sealing resin 70. Groove 53 is formed so as to surround exposed portion 52. Groove 53 is formed on first surface 50*b* and second surface 50*c* of exposed portion 52. First surface 50*b* of exposed portion 52 is recessed toward second surface 50*c* in groove 53. Second surface 50*c* of exposed portion 52 is recessed toward first surface 50*b* in groove 53.

(Method of Manufacturing Semiconductor Device 100A)

Hereinafter, a method of manufacturing semiconductor device 100A will be described.

Figure 11:
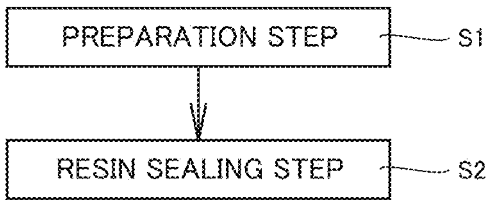
FIG. 11 is a step chart illustrating a method of manufacturing semiconductor device 100A.

FIG. 11 is a step chart illustrating the method of manufacturing semiconductor device 100A. As illustrated in FIG. 11, the method of manufacturing semiconductor device 100A does not include connector attaching step S3. Connector 80 is already connected to circuit board 50 at a stage of preparation step S1.

Figure 12:
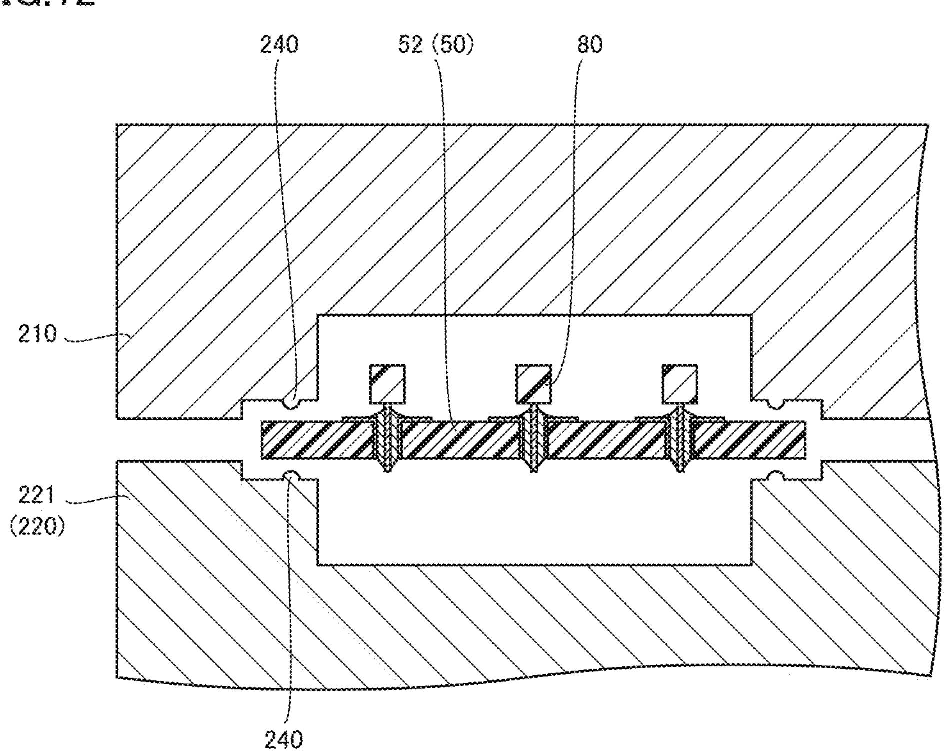
FIG. 12 is a first explanatory view for describing a resin sealing step S2 in the method of manufacturing semiconductor device 100A.
Figure 13:
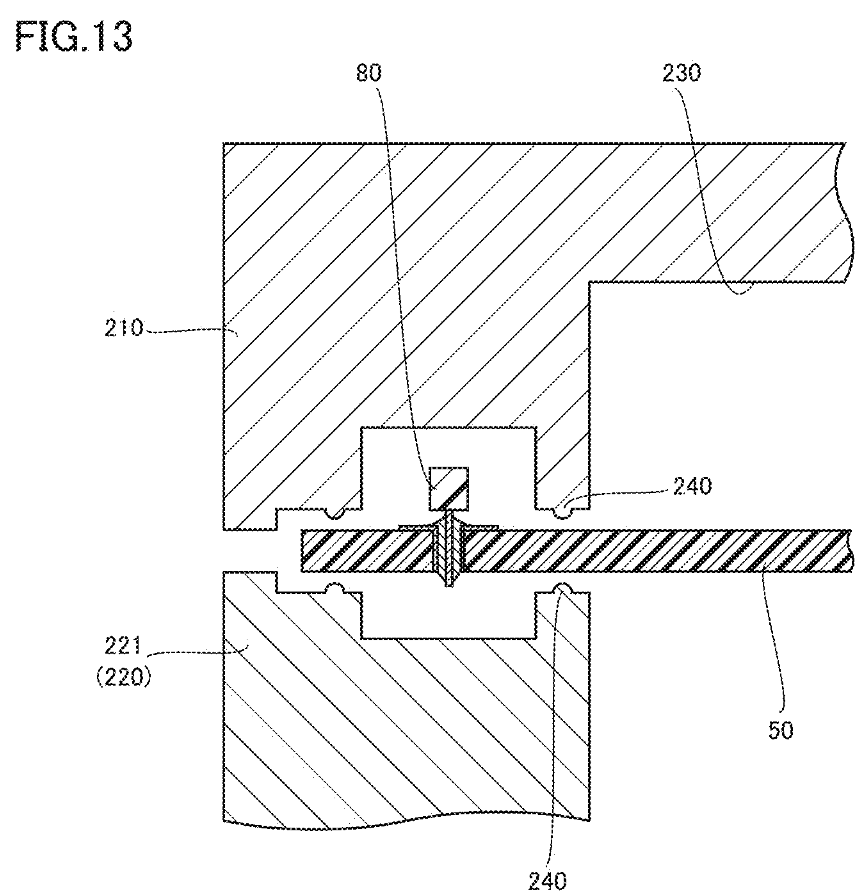
FIG. 13 is a second explanatory view for describing resin sealing step S2 in the method of manufacturing semiconductor device 100A.

FIG. 12 is a first explanatory view for describing resin sealing step S2 in the method of manufacturing semiconductor device 100A. FIG. 13 is a second explanatory view for describing resin sealing step S2 in the method of manufacturing semiconductor device 100A. As illustrated in FIGS. 12 and 13, in mold 200 used in resin sealing step S2 in the method of manufacturing semiconductor device 100A, a protrusion 240 is formed in support portion 221 and a portion of upper mold 210 facing support portion 221. Protrusion 240 is formed so as to surround a portion of circuit board 50 to be exposed portion 52.

When upper mold 210 and lower mold 220 are clamped, protrusion 240 crushes first surface 50*b* and second surface 50*c* around the portion of circuit board 50 to be exposed portion 52. Therefore, uncured sealing resin 70 supplied into cavity 230 is not supplied to the portion of circuit board 50 to be exposed portion 52. A portion crushed by protrusion 240 becomes groove 53. From another point of view, groove 53 is a compression mark formed by protrusion 240.

(Effects of Semiconductor Device 100A)

Hereinafter, effects of semiconductor device 100A will be described.

In semiconductor device 100A, protrusion 240 crushes first surface 50*b* and second surface 50*c* around the portion of circuit board 50 to be exposed portion 52, and this configuration prevents uncured sealing resin 70 from being supplied to the portion of circuit board 50 to be exposed portion 52. Therefore, in semiconductor device 100A, even though there is a level difference on first surface 50*b* and second surface 50*c* around the portion of circuit board 50 to be exposed portion 52, supply of uncured sealing resin 70 to the portion of circuit board 50 to be exposed portion 52 is more reliably suppressed.

Third Embodiment

A semiconductor device according to a third embodiment (hereinafter referred to as "semiconductor device 100B") will be described. Here, differences from semiconductor device 100A will be mainly described, and redundant description will not be repeated.

(Configuration of Semiconductor Device 100B)

Hereinafter, a configuration of semiconductor device 100B will be described.

Figure 14:
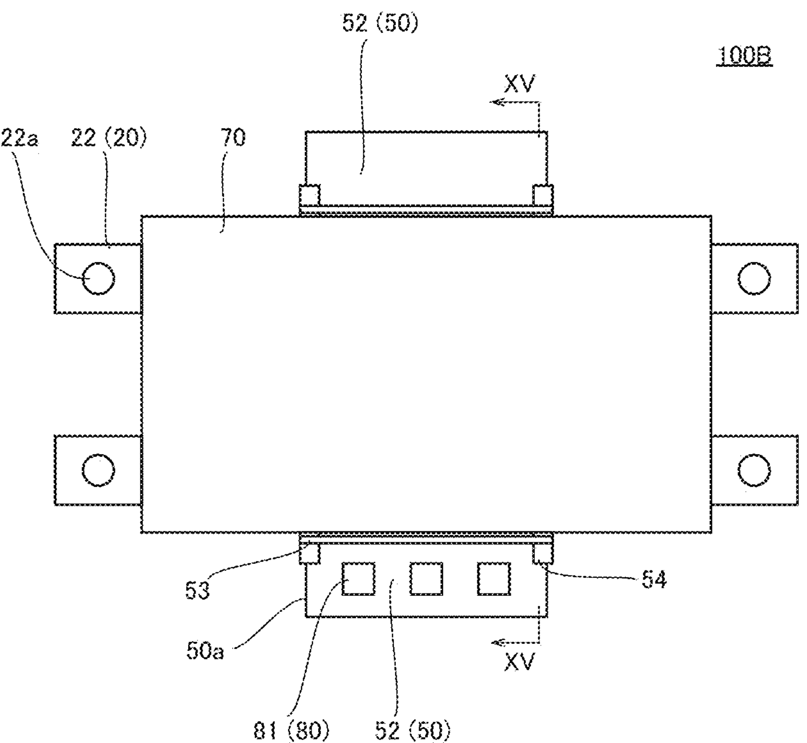
FIG. 14 is a plan view of a semiconductor device 100B.
Figure 15:
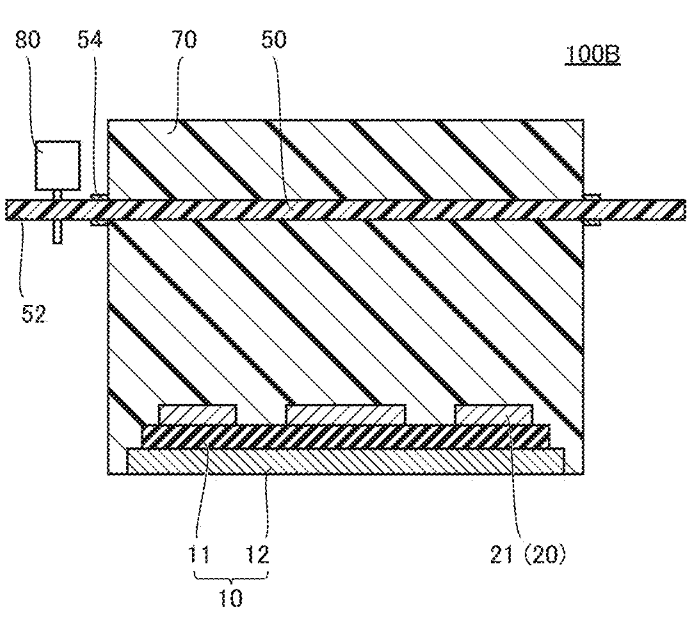
FIG. 15 is a sectional view taken along line XV-XV in FIG. 14.
Figure 16:
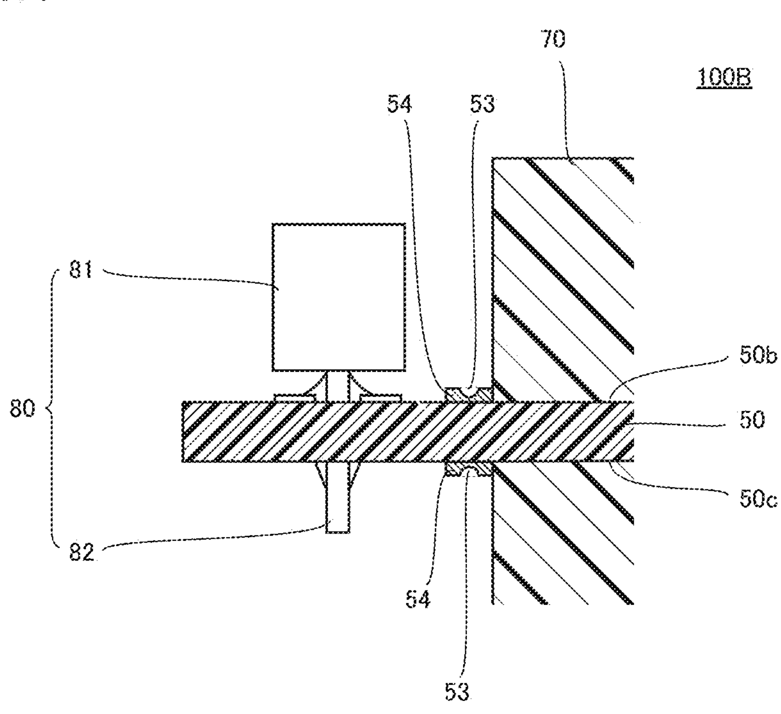
FIG. 16 is a partially enlarged view of FIG. 15.

FIG. 14 is a plan view of semiconductor device 100B. FIG. 15 is a sectional view taken along line XV-XV in FIG. 14. FIG. 16 is a partially enlarged view of FIG. 15. As illustrated in FIGS. 14, 15, and 16, in semiconductor device 100B, circuit board 50 includes a metal body 54.

As illustrated in FIGS. 14, 15, and 16, metal body 54 covers side surface 50*a*, the peripheral edge of first surface 50*b* continuous with side surface 50*a*, and the peripheral edge of second surface 50*c* continuous with side surface 50*a*. Metal body 54 is formed with a metal material (for example, copper). The number of metal bodies 54 is plural. In the examples shown in FIGS. 14, 15, and 16, the number of metal bodies 54 is two.

As illustrated in FIGS. 14, 15, and 16, metal body 54 is at the boundary between exposed portion 52 and sealing resin 70. In semiconductor device 100B, groove 53 extends along the boundary between exposed portion 52 and sealing resin 70 and passes over metal body 54. In semiconductor device 100, groove 53 need not be formed so as to surround exposed portion 52. In semiconductor device 100B, side surface 50*a* around exposed portion 52 is not covered with sealing resin 70.

(Effects of Semiconductor Device 100B)

In a manufacturing process of semiconductor device 100B, when upper mold 210 and lower mold 220 are clamped, protrusion 240 comes into contact with metal body 54 to deform metal body 54. As a result, deformed metal body 54 fills a gap between circuit board 50 and upper mold 210 and lower mold 220. Therefore, in semiconductor device 100B, sealing resin 70 is prevented from flowing around to side surface 50*a* around exposed portion 52.

Fourth Embodiment

A semiconductor device according to a fourth embodiment (hereinafter referred to as "semiconductor device 100C") will be described. Here, differences from semiconductor device 100 will be mainly described, and redundant description will not be repeated.

Figure 17:
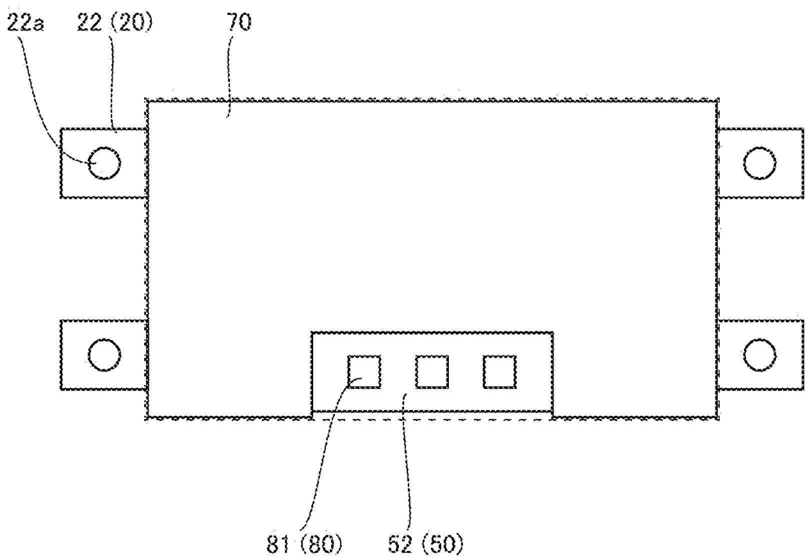
FIG. 17 is a plan view of a semiconductor device 100C.

FIG. 17 is a plan view of semiconductor device 100C. As illustrated in FIG. 17, exposed portion 52 is inside the outline of sealing resin 70 in plan view (when viewed along the thickness direction of semiconductor device 100). The outline of sealing resin 70 in plan view is indicated by a dotted line in FIG. 17. The outline of sealing resin 70 in plan view has a rectangular shape circumscribing sealing resin 70.

Figure 18:
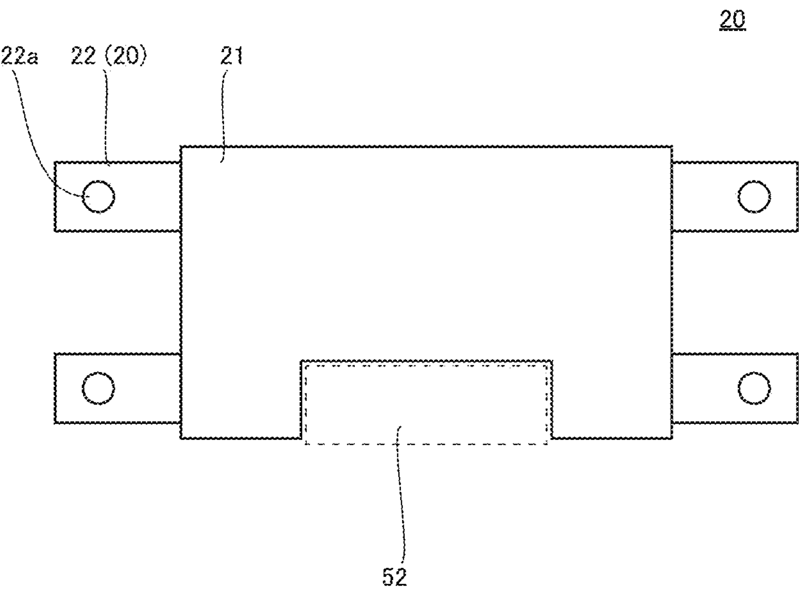
FIG. 18 is a plan view of a lead frame 20 used in semiconductor device 100C.

FIG. 18 is a plan view of lead frame 20 used in semiconductor device 100C. Since exposed portion 52 is sandwiched between upper mold 210 and lower mold 220, a portion of lead frame 20 at a position overlapping exposed portion 52 in plan view is removed as illustrated in FIG. 18. In FIG. 17, the position of exposed portion 52 is indicated by a dotted line.

Fifth Embodiment

A power converter according to a fifth embodiment (hereinafter referred to as "power converter 300") will be described.

In the fifth embodiment, the semiconductor devices according to the first to fourth embodiments are applied to a power converter. Although the present disclosure is not limited to a specific power converter, a case where the present disclosure is applied to a three-phase inverter will be described below as the fifth embodiment.

(Configuration of Power Converter 300)

Hereinafter, a configuration of power converter 300 will be described.

Figure 19:
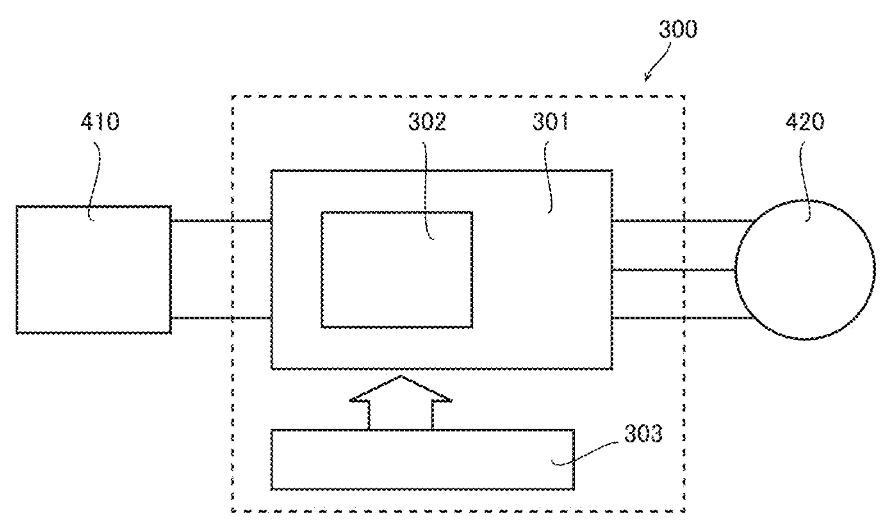
FIG. 19 is a block diagram illustrating a configuration of a power conversion system to which a power converter 300 is applied.

FIG. 19 is a block diagram illustrating a configuration of a power conversion system to which power converter 300 is applied. The power conversion system illustrated in FIG. 19 includes power converter 300, a power supply 410, and a load 420.

Power supply 410 is a DC power supply that supplies DC power to power converter 300. Power supply 410 can be configured by various devices. Power supply 410 can be configured by, for example, a DC system, a solar cell, or a storage battery. Power supply 410 may be configured by a rectifier circuit or an AC/DC converter connected to an AC system. Power supply 410 may be configured by a DC/DC converter that converts DC power output from the DC system into predetermined power.

Load 420 is a three-phase electric motor driven by AC power supplied from power converter 300. Load 420 is not limited to a specific application. Load 420 is an electric motor mounted on various electric devices. Load 420 is used as, for example, an electric motor for a hybrid vehicle, an electric vehicle, a railway vehicle, an elevator, or an air conditioner.

Power converter 300 is a three-phase inverter connected between power supply 410 and load 420. Power converter 300 converts DC power supplied from power supply 410 into AC power and supplies the AC power to load 420. As illustrated in FIG. 18, power converter 300 includes a main conversion circuit 301 that converts DC power into AC power and outputs the AC power, and a control circuit 303 that outputs a control signal controlling main conversion circuit 301 to main conversion circuit 301.

(Detailed Configuration of Power Converter 300)

Hereinafter, details of the configuration of power converter 300 will be described.

Although not shown, main conversion circuit 301 includes a switching element and a freewheeling diode. Main conversion circuit 301 converts DC power supplied from power supply 410 into AC power by switching of the switching element, and supplies the AC power to load 420.

Although there are various specific circuit configurations of main conversion circuit 301, main conversion circuit 301 according to the fifth embodiment is a two-level three-phase full bridge circuit, and includes six switching elements and six freewheeling diodes antiparallel to the respective switching elements.

At least one of the switching elements and each freewheeling diode of main conversion circuit 301 is a switching element or a freewheeling diode included in a semiconductor device 302 corresponding to the semiconductor device according to any one of the first to fourth embodiments.

The six switching elements are connected in series for every two switching elements to form upper and lower arms. Each of the upper and lower arms constitutes each phase (U-phase, V-phase, and W-phase) of the full bridge circuit. Output terminals of the upper and lower arms, that is, three output terminals of main conversion circuit 301 are connected to load 420.

Main conversion circuit 301 includes a drive circuit (not shown) that drives each switching element. The drive circuit may be built in semiconductor device 302 or may be configured separately from semiconductor device 302. The drive circuit generates a drive signal for driving each switching element of main conversion circuit 301, and supplies the drive signal to a control electrode of each switching element of main conversion circuit 301.

Specifically, the drive circuit outputs a drive signal for turning on each switching element and a drive signal for turning off each switching element to the control electrode of each switching element in accordance with a control signal from the control circuit 303 to be described later. In a case where the switching element is maintained in an on-state, the drive signal is a voltage signal (on-signal) greater than or equal to a threshold voltage of the switching element. In a case where the switching element is maintained in an off-state, the drive signal is a voltage signal (off-signal) lower than or equal to a threshold voltage of the switching element.

Control circuit 303 controls the switching elements of main conversion circuit 301 so that desired power is supplied to load 420. Specifically, a time (on-time) at which each switching element of main conversion circuit 301 is to be turned on is calculated on the basis of power to be supplied to load 420. For example, main conversion circuit 301 can be controlled by PWM control that modulates the on-time of the switching elements in accordance with a voltage to be output. Control circuit 303 outputs a control command (control signal) to the drive circuit of main conversion circuit 301 so that an on-signal and an off-signal are output respectively to the switching element to be turned on and the switching element to be turned off at each time point. The drive circuit of main conversion circuit 301 outputs an on-signal or an off-signal as a drive signal to the control electrode of each switching element in accordance with the control signal.

(Effects of Power Converter 300)

In the power converter 300, since the semiconductor devices according to the first to fourth embodiments are applied as semiconductor device 302 constituting main conversion circuit 301, semiconductor device 302 and control circuit 303 can be easily connected.

In the fifth embodiment, an example in which the present disclosure is applied to a two-level three-phase inverter has been described, but the present disclosure is not limited thereto, and can be applied to various power converters. In the present embodiment, a two-level power converter is used, but a three-level or multi-level power converter may be used, or the present disclosure may be applied to a single-phase inverter in a case where power is supplied to a single-phase load. In a case where power is supplied to a DC load or the like, the present disclosure can also be applied to a DC/DC converter or an AC/DC converter.

The power converter to which the present disclosure is applied is not limited to the case where the load described above is an electric motor. For example, the power converter can be used as a power supply device of an electric discharge machine, a laser beam machine, an induction heating cooker, or a non-contact power feeding system, and can also be used as a power conditioner of a solar power generation system, a power storage system, or the like.

It should be understood that the embodiments disclosed herein are illustrative in all respects and not restrictive. The basic scope of the present disclosure is defined not by the above embodiments but by the claims and is intended to include meanings equivalent to the claims and all modifications within the scope.

REFERENCE SIGNS LIST

10: insulating base material, 10*a*: first surface, 10*b*: second surface, 11: insulating sheet, 12: metal foil, 20: lead frame, 20*a*: first surface, 20*b*: second surface, 21: bottom, 22: lead, 22*a*: penetration hole, 30: semiconductor element, 40: connection layer, 50: circuit board, 50*a*: side surface, 50*b*: first surface, 50*c*: second surface, 50*d*: through hole, 51: conductor film, 52: exposed portion, 53: groove, 54: metal body, 60*a*, 60*b*: wire, 70: sealing resin, 80: connector, 81: case portion, 82: terminal portion, 83: connection layer, 100, 100A, 100B, 100C: semiconductor device, 200: mold, 210: upper mold, 220: lower mold, 221: support portion, 230: cavity, 240: protrusion, 300: power converter, 301: main conversion circuit, 302: semiconductor device, 303: control circuit, 410: power supply, 420: load, S1: preparation step, S2: resin sealing step, S3: connector attaching step

The invention claimed is:

1. A semiconductor device comprising:

a lead frame having a mount surface;

a semiconductor element disposed on the mount surface;

a circuit board disposed apart from the mount surface in a thickness direction of the semiconductor device and electrically connected to the lead frame;

a sealing resin to seal the lead frame, the semiconductor element, and the circuit board; and a connector having a terminal portion, wherein the lead frame includes a lead exposed from the sealing resin, the circuit board has at least one exposed portion exposed from the sealing resin, and the terminal portion of the connector is exposed from the sealing resin and the terminal portion is electrically connected to one of the at least one exposed portion.

2. The semiconductor device according to claim 1, wherein a thickness of the at least one exposed portion is smaller than a thickness of a portion of the circuit board sealed with the sealing resin.

3. The semiconductor device according to claim 1, wherein a groove is formed in a portion of the circuit board at a boundary between the at least one exposed portion and the sealing resin.

4. The semiconductor device according to claim 1, wherein the groove is formed so as to surround each of the at least one exposed portion.

5. The semiconductor device according to claim 3, wherein the circuit board has a side surface, and the side surface around the at least one exposed portion is covered with the sealing resin.

6. The semiconductor device according to claim 1, wherein the circuit board has a side surface, and a first surface and a second surface continuous with the side surface, and the circuit board includes a plurality of metal bodies, and each of the plurality of metal bodies covers the side surface, a peripheral edge of the first surface continuous with the side surface, and a peripheral edge of the second surface continuous with the side surface, each of the plurality of metal bodies is at the boundary between the at least one exposed portion and the sealing resin, and the groove passes over the plurality of metal bodies.

7. The semiconductor device according to claim 6, wherein the side surface around each of the at least one exposed portion is exposed from the sealing resin.

8. The semiconductor device according to claim 1, wherein a number of the at least one exposed portion is greater than or equal to two.

9. The semiconductor device according to claim 1, wherein a through hole into which the terminal portion of the connector is inserted is formed in one of the at least one exposed portion.

10. The semiconductor device according to claim 1, wherein the at least one exposed portion is inside an outline of the sealing resin when viewed along a thickness direction of the semiconductor device.

11. The semiconductor device according to claim 1, wherein a penetration hole through which a screw is inserted is formed in the lead.

12. The semiconductor device according to claim 1, wherein the connector serves as a control terminal of the semiconductor device, and the lead serves as a main circuit terminal of the semiconductor device.

13. A power converter comprising:

a main conversion circuit to convert and output input power, the main conversion circuit including the semiconductor device according to claim 1; and a control circuit to output a control signal controlling the main conversion circuit to the main conversion circuit.

* * * * *